(12) United States Patent
Annampedu et al.

(10) Patent No.: US 9,083,366 B1
(45) Date of Patent: Jul. 14, 2015

(54) ALIGNMENT OF SAMPLING PHASES IN A MULTI-CHANNEL TIME-INTERLEAVED ANALOG-TO-DIGITAL CONVERTER

(71) Applicant: LSI Corporation, San Jose, CA (US)

(72) Inventors: Viswanath Annampedu, Schnecksville, PA (US); Amaresh V. Malipatil, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/220,257

(22) Filed: Mar. 20, 2014

Related U.S. Application Data

(60) Provisional application No. 61/951,710, filed on Mar. 12, 2014.

(51) Int. Cl.
  *H03M 1/12*  (2006.01)
  *H03M 1/08*  (2006.01)
  *H03M 1/18*  (2006.01)

(52) U.S. Cl.
  CPC .......... *H03M 1/0836* (2013.01); *H03M 1/1245* (2013.01); *H03M 1/18* (2013.01)

(58) Field of Classification Search
  CPC ..... H03M 1/12; H03M 1/121; H03M 1/0836; H03M 1/1245; H03M 1/18
  USPC ................................................ 341/118, 155
  See application file for complete search history.

(56) References Cited

U.S. PATENT DOCUMENTS

| | | | |
|---|---|---|---|
| 7,233,270 B2 * | 6/2007 | Lin ............................... | 341/118 |
| 7,330,507 B2 * | 2/2008 | Levasseur et al. ............ | 375/232 |
| 7,706,434 B1 * | 4/2010 | Farjadrad et al. ............. | 375/222 |
| 7,778,320 B2 * | 8/2010 | Agazzi et al. ................. | 375/229 |
| 7,844,019 B2 | 11/2010 | Agazzi | |
| 7,974,369 B2 | 7/2011 | Liu et al. | |
| 8,120,395 B2 | 2/2012 | Williams et al. | |
| 8,588,355 B2 | 11/2013 | Huang | |
| 8,649,476 B2 | 2/2014 | Malipatil et al. | |

OTHER PUBLICATIONS

Aziz, P., et al., "Symbol Rate Timing Recovery for Higher Order Partial Response Channels," IEEE Journal on Selected Areas in Communications, vol. 19, No. 4, pp. 635-648.

Haftbaradaran, Afshin, et al., "Mismatch Compensation Techniques Using Random Data for Time-Interleaved A/D Converters," Proceedings. 2006 IEEE International Symposium on Circuits and Systems, 2006. ISCAS 2006, pp. 3402-3405.

* cited by examiner

*Primary Examiner* — Khai M Nguyen

(57) ABSTRACT

A multi-channel analog-to-digital (ADC) converter coupled to a clock-and-data-recovery loop that has a plurality of clock-recovery circuits, each configured to set the sampling phase for a respective one of the ADC channels in a manner that causes the different sampling phases to be appropriately time-aligned with one another for time-interleaved operation of the ADC channels. In an example embodiment, an individual clock-recovery circuit comprises a phase detector and a loop filter. Loop filters corresponding to different clock-recovery circuits may be coupled to one another by having shared circuit elements in their frequency-tracking paths and/ or by being configured to receive timing gradients from more than one phase detector, including the phase detector of a selected one of the clock-recovery circuits.

20 Claims, 4 Drawing Sheets

300

400

ALIGNMENT OF SAMPLING PHASES IN A MULTI-CHANNEL TIME-INTERLEAVED ANALOG-TO-DIGITAL CONVERTER

CROSS-REFERENCE TO RELATED APPLICATIONS

This application claims priority from U.S. Provisional Patent Application No. 61/951,710, filed 12 Mar. 2014, and entitled "ALIGNMENT OF SAMPLING PHASES IN A MULTI-CHANNEL TIME-INTERLEAVED ANALOG-TO-DIGITAL CONVERTER."

FIELD

The present disclosure relates to electrical circuits and, more specifically but not exclusively, to integrated circuits that include analog-to-digital converters.

BACKGROUND

For data recovery with a relatively low bit-error rate (BER), it is desirable to sample the data-carrying analog signal at proper times (sampling phases) for having it quantized and digitized in an analog-to-digital converter (ADC). To increase the data rate, a multi-channel ADC architecture may be used in which the individual channel ADCs operate at a relatively low speed while the effective higher speed is achieved by time-interleaving their outputs. However, one problem with the multi-channel ADC architecture is that the sampling phases of the individual channel ADCs may be misaligned, e.g., due to fabrication-process variances affecting different channel ADCs in different ways, temperature variations, and circuit aging. Disadvantageously, the misalignment of sampling phases may generate undesirable noise and degrade the overall performance characteristics of a time-interleaved ADC.

SUMMARY

Disclosed herein are various embodiments of a multi-channel analog-to-digital (ADC) converter coupled to a clock-and-data-recovery loop having a plurality of clock-recovery circuits, each configured to set the sampling phase for a respective one of the ADC channels in a manner that causes the different sampling phases to be appropriately time-aligned with one another for time-interleaved operation of the ADC channels. In an example embodiment, an individual clock-recovery circuit comprises a phase detector and a loop filter. Loop filters corresponding to different clock-recovery circuits may be coupled to one another by having shared circuit elements in their frequency-tracking paths and/or by being configured to receive timing gradients from more than one phase detector, including the phase detector of a selected one of the clock-recovery circuits.

BRIEF DESCRIPTION OF THE FIGURES

Other embodiments of the disclosure will become more fully apparent from the following detailed description and the accompanying drawings, in which.

DETAILED DESCRIPTION

Figure 1:
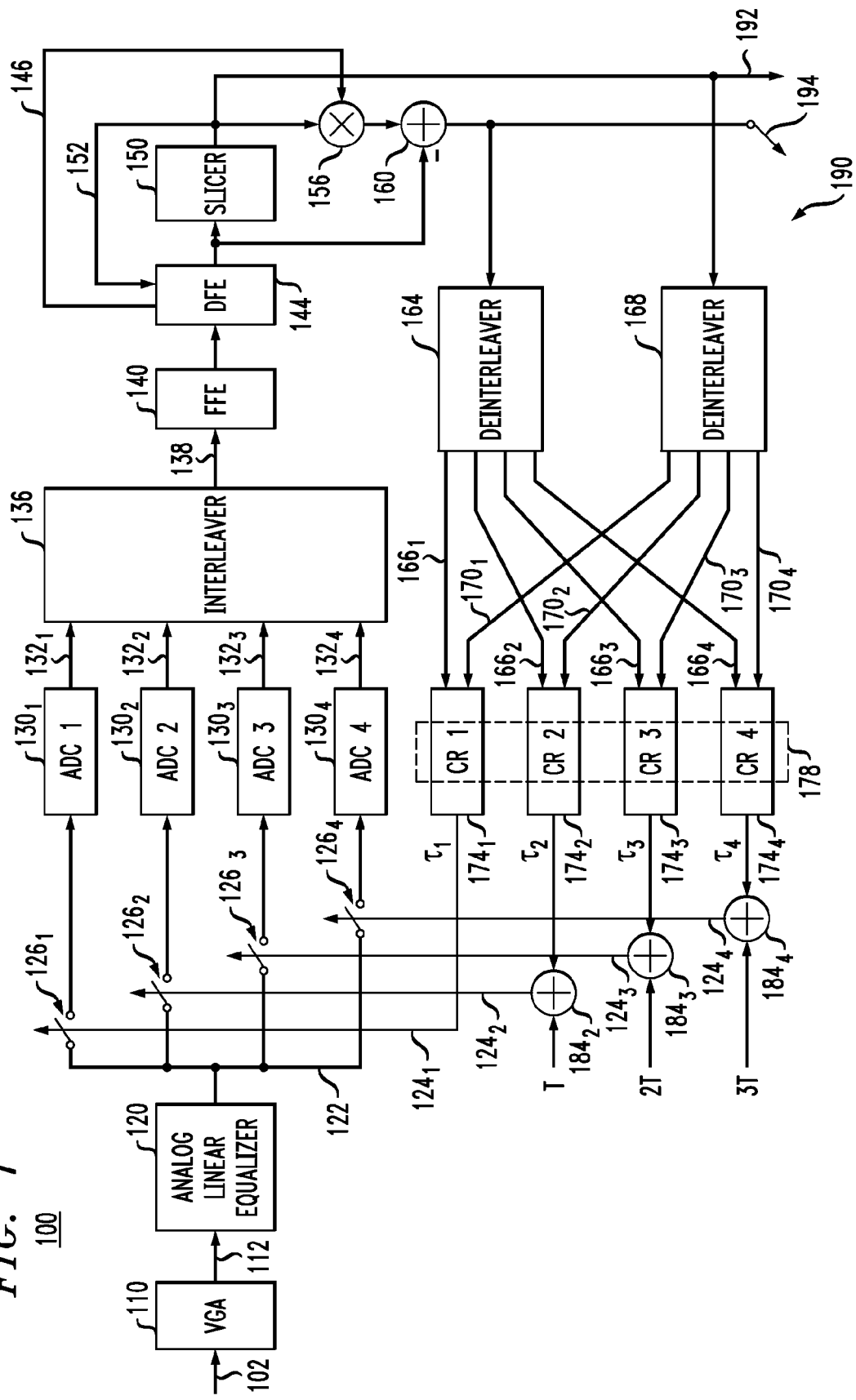
FIG. 1 shows a block diagram of a receiver circuit having a time-interleaved analog-to-digital converter according to an embodiment of the disclosure.

FIG. 1 shows a block diagram of a receiver circuit 100 having a time-interleaved analog-to-digital converter (ADC) according to an embodiment of the disclosure. For illustration purposes, circuit 100 is shown in FIG. 1 as having four ADC channels. In an alternative embodiment, circuit 100 may have M ADC channels, where M is an integer greater than one. Due to commercial considerations and/or technological limitations, practical embodiments of circuit 100 may be limited to those corresponding to the value of M not exceeding about 32 or about 16.

Circuit 100 is configured to receive an electrical input signal 102 modulated with data. Circuit 100 is further configured to process input signal 102, e.g., as further described below, to recover the data. The recovered data may then be directed to external circuits via an electrical output signal 192 (also see FIG. 4). Based on the signal processing, circuit 100 may also generate an error signal 194 that is indicative of the noise level.

Circuit 100 includes a variable gain amplifier 110 configured to amplify input signal 102 in a manner that causes a resulting amplified electrical signal 112 to have a suitable (e.g., nearly optimal) amplitude for being processed in the downstream circuitry. Signal 112 is then conditioned by being filtered in an analog linear equalizer 120. The filtering implemented in equalizer 120 transforms signal 112 into a corresponding filtered signal 122 and may include but is not limited to removing or attenuating some undesirable frequency components and appropriately shaping various analog waveforms.

Circuit 100 further includes four ADCs $130_1$-$130_4$ that represent the four (M=4) ADC channels of the circuit. Each of ADCs $130_1$-$130_4$ operates at a reduced rate $R_r$ equal to one quarter of the effective full rate $R_f$ of circuit 100. In mathematical terms, $R_r=R_f/4=1/(4T)$, where T is the duration of a signaling interval or symbol period. In the above-mentioned alternative embodiments, $R_r=R_f/M=1/(MT)$. The sampling phase $\tau_i$ of ADC $130_i$ (where i=1, 2, 3, 4) is controlled by a clock-and-data recovery (CDR) loop 190 of circuit 100 as further described below. In an example embodiment, $0 \le \tau_i < T$.

In FIG. 1, the signal sampling process is schematically shown as involving the periodic closing and opening of switches $126_1$-$126_4$, which is performed based on control signals $124_1$-$124_4$, respectively. The time instances at which control signals $124_1$-$124_4$ cause switches $126_1$-$126_4$ to close to enable ADCs $130_1$-$130_4$ to sample signal 122 are given by Eqs. (1a)-(1d), respectively:

$$t_1 = 4kT + \tau_1 \quad (1a)$$

$$t_2 = 4kT + T + \tau_2 \quad (1b)$$

$$t_3 = 4kT + 2T + \tau_3 \quad (1c)$$

$$t_4 = 4kT + 3T + \tau_4 \quad (1d)$$

where k is an integer time index. One of ordinary skill in the art will understand that no signal samples are being generated by ADC $130_i$ when switch $126_i$ is open. A stream of signal samples generated ADC $130_i$ is a digital signal $132_i$ having reduced rate $R_r$. In alternative embodiments, other suitable circuit means can similarly be used to configure or trigger ADCs $130_1$-$130_4$ to sample signal 122 at the time instances given by Eqs. (1a)-(1d) to generate digital signals (sample streams) $132_1$-$132_4$.

An interleaver 136 operates to time-interleave digital signals $132_1$-$132_4$ generated by ADCs $130_1$-$130_4$ to generate a full-rate sample stream 138, wherein each signaling interval T carries a different respective sample of signal 122. Sample stream 138 can then be processed in a conventional manner, e.g., as known in the art, to recover the data carried by input signal 102 and generate output signal 192. In the embodiment shown in FIG. 1, the portion of CDR loop 190 configured to generate output signal 192 from full-rate sample stream 138 is illustratively shown as including a feed-forward equalizer (FFE) 140, a decision-feedback equalizer (DFE) 144, and a slicer 150. In alternative embodiments, this portion of CDR loop 190 may be modified, as known in the art, to have a different suitable composition.

Feed-forward equalizer 140 and decision-feedback equalizer 144 operate to mitigate or remove the effects of inter-symbol interference (ISI). Feed-forward equalizer 140 is configured to reduce the precursor ISI and shorten the impulse response. Decision-feedback equalizer 144 is configured to augment feed-forward equalizer 140 by using a filtered version of previous symbol estimates received from slicer 150 via a feedback signal 152 to reduce the post-cursor ISI. In operation, decision-feedback equalizer 144 corrects the signal sample values based on feedback signal 152 to enable slicer 150 to more-accurately discriminate between a logical high and a logical low. Decision-feedback equalizer 144 also provides the estimated target signal level to a multiplier 156 via a control signal 146. Multiplier 156 uses the estimated target signal level to scale the logical output of slicer 150. An adder 160 then generates error signal 194 by subtracting a corrected sample value received from decision-feedback equalizer 144 from a corresponding scaled logical output value generated by multiplier 150. Note that the sequence of logical outputs of slicer 150 is used to generate output signal 192. Further note that both output signal 192 and error signal 194 are clocked at the full rate $R_f$ of circuit 100.

The clock-recovery (CR) portion of CDR loop 190 operates to set sampling phases $\tau_1$-$\tau_4$ for ADCs $130_1$-$130_4$ based on output signal 192 and error signal 194. In an example embodiment, the CR portion of CDR loop 190 includes de-interleavers 164 and 168, CR circuits $174_1$-$174_4$, and optional adders $184_2$-$184_4$. De-interleaver 164 is configured to de-interleave error signal 194 to generate reduced-rate error signals $166_1$-$166_4$. De-interleaver 168 is similarly configured to de-interleave output signal 192 to generate reduced-rate data signals $170_1$-$170_4$. CR circuit $174_i$ (where i=1, 2, 3, 4) is configured to determine sampling phase $\tau_i$ based on reduced-rate error signal $166_i$ and reduced-rate data signal $170_i$. Some embodiments may use adder $184_j$ (where j=2, 3, 4) to shift the sampling phase $\tau_j$ received from CR circuit $174_j$ by a value of (j−1)T, e.g., to make it better suitable for triggering ADCs $130_1$-$130_4$.

Example embodiments of CR circuits $174_1$-$174_4$ are described below in reference to FIGS. 2 and 3. In some embodiments, CR circuits $174_1$-$174_4$ may have some commonly used or shared circuitry, which is schematically indicated in FIG. 1 by a dashed-line block 178. The use of shared circuitry 178 may be beneficial, e.g., because it enables a potential reduction in the overall circuit complexity and/or cost through elimination of redundant circuits and/or utilization of intra-circuit efficiencies.

Figure 2:
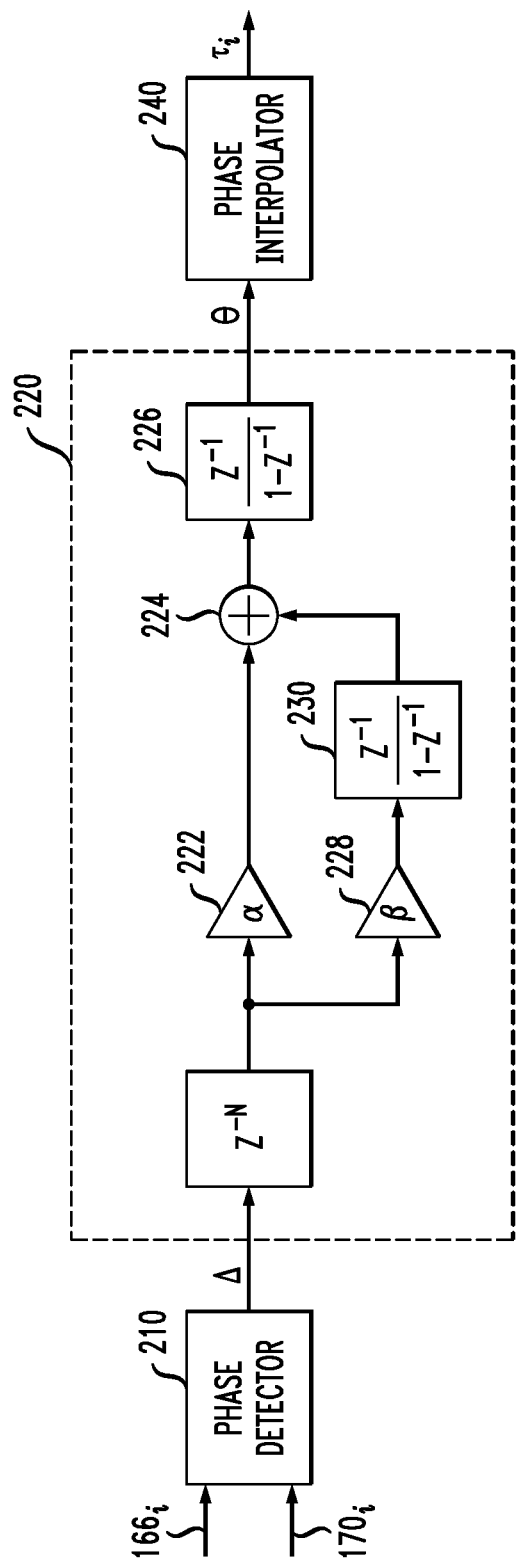
FIG. 2 shows a block diagram of a clock-recovery (CR) circuit that can be used in the receiver circuit of FIG. 1 according to an embodiment of the disclosure.

FIG. 2 shows a block diagram of a CR circuit 200 that can be used as any of CR circuits $174_1$-$174_4$ (FIG. 1) according to an embodiment of the disclosure. CR circuit 200 is shown in FIG. 2 as being configured to receive reduced-rate error signal $166_i$ and reduced-rate data signal $170_i$. These signals are processed in CR circuit 200, e.g., as described below, to determine sampling phase $\tau_i$ for ADC $130_i$. In the shown configuration, CR circuit 200 can be used as CR circuit $174_i$. In one embodiment, four different, appropriately configured instances (copies) of circuit 200 can be used in place of CR circuits $174_1$-$174_4$ in circuit 100 (FIG. 1).

In an example embodiment, CR circuit 200 includes a phase detector 210, a loop filter 220, and a phase interpolator 240.

Phase detector 210 is configured to process reduced-rate error signal $166_i$ and reduced-rate data signal $170_i$ to determine the timing gradient (Δ) that is proportional to a desired change in the sampling phase $\tau_i$. In various embodiments, various suitable timing-recovery algorithms may be used in phase detector 210. For example, the timing-recovery algorithm used in phase detector 210 can be (i) a slope-based minimum mean-square error (MMSE) algorithm; (ii) a maximum-likelihood algorithm; or (iii) a Mueller-Muller algorithm. A more-detailed description of these algorithms can be found, e.g., in an article by P. Aziz and S. Surendran, entitled "Symbol Rate Timing Recovery for Higher Order Partial Response Channels," published in the IEEE Journal on Selected Areas in Communications, Vol. 19, No. 4, pp. 635-648, which is incorporated herein by reference in its entirety. Suitable circuits that can be used to implement phase detector 210 are disclosed, e.g., in U.S. Pat. Nos. 8,649,476, 8,588, 355, 8,120,395, 7,974,369, and 7,844,019, all of which are incorporated herein by reference in their entirety.

Loop filter 220 is configured to combine present and past values of timing gradient Δ to obtain an estimate for a phase change (θ) over an update interval. In an example embodiment shown in FIG. 2, loop filter 220 comprises a second-order digital phase-locked loop (DPLL) having the transfer function, L(z), given by Eq. (2):

$$L(z) = z^{-N}\left(\frac{\beta z^{-1}}{1-z^{-1}} + \alpha\right)\left(\frac{z^{-1}}{1-z^{-1}}\right) \quad (2)$$

where the term $z^{-N}$ represents the loop latency; α is the phase-update gain; and β is the frequency-update gain. The DPLL of loop filter 220 has a first-order path (including elements 222, 224, and 226) and a second-order path (including elements 228, 230, 224, and 226) configured to track the phase and frequency, respectively. A circuit element in loop filter 220 that implements a $z^{-1}$ term of the transfer function can be, e.g., a shift register clocked at the reduced rate $R_r$. In alternative embodiments, other suitable loop-filter architectures can similarly be used to implement loop filter 220.

Phase interpolator 240 is configured to calculate sampling phase $\tau_i$ based on the estimated phase change θ received from loop filter 220. The calculated sampling phase $\tau_i$ can then be used to clock ADC $130_i$, e.g., as indicated above in reference to FIG. 1.

Figure 3:
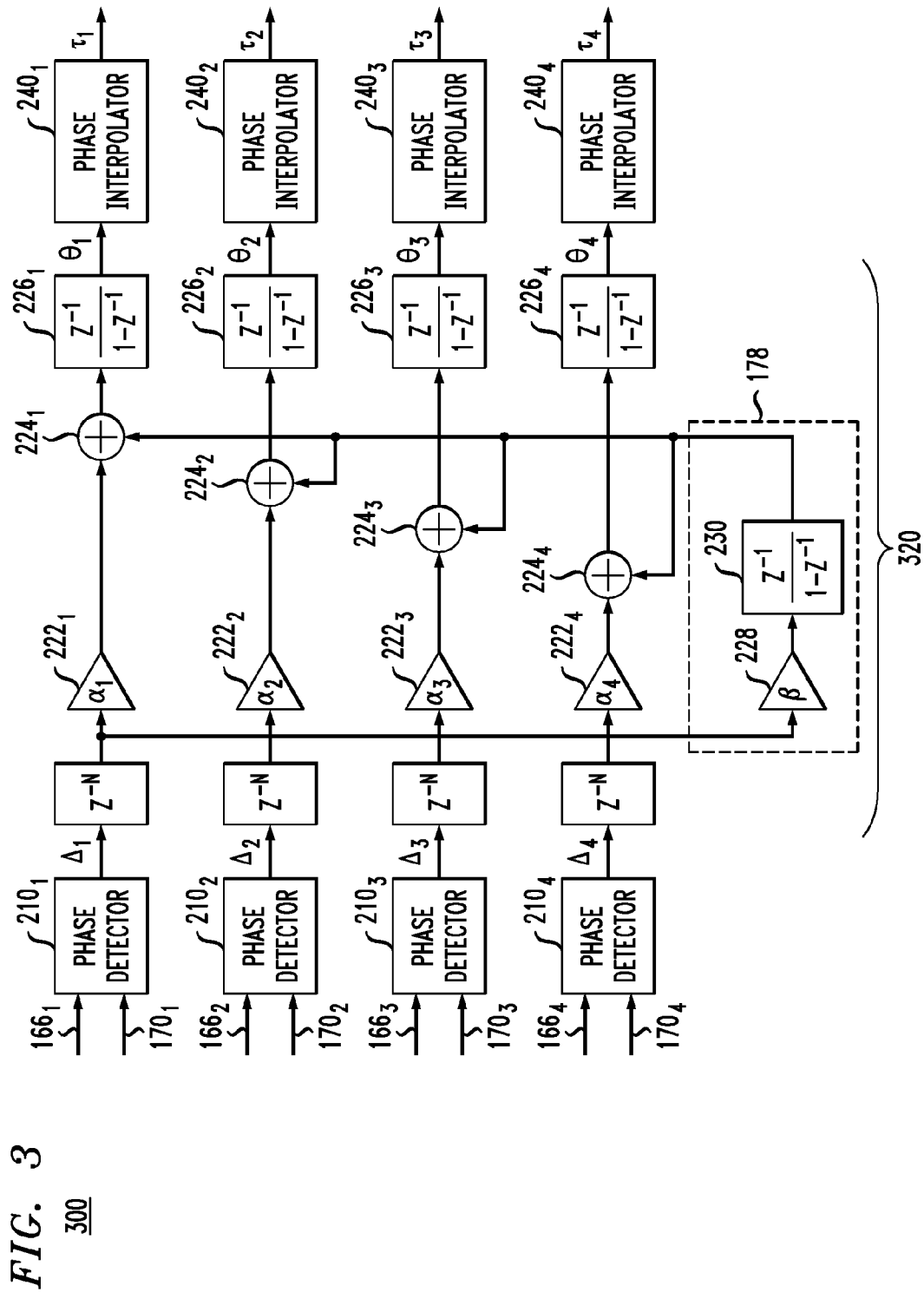
FIG. 3 shows a block diagram of a CR circuit that can be used in the receiver circuit of FIG. 1 according to an alternative embodiment of the disclosure.

FIG. 3 shows a block diagram of a CR circuit 300 that can be used in place of CR circuits $174_1$-$174_4$ (FIG. 1) according to an embodiment of the disclosure. CR circuit 300 is functionally analogous to a combination of four CR circuits 200 (FIG. 2). As such, CR circuit 300 uses many of the same circuit elements as CR circuit 200. These elements are labeled using the same labels as in FIG. 2, except that different element copies are designated using different respective label subscripts (e.g., 1 through 4).

CR circuit 300 includes four phase detectors $210_1$-$210_4$. Phase detector $210_i$ is configured to process reduced-rate error signal $166_i$ and reduced-rate data signal $170_i$ to determine timing gradient $\Delta_i$, where i=1, 2, 3, 4. CR circuit 300 further includes four phase interpolators $240_1$-$240_4$. Phase interpolator $240_i$ is configured to calculate sampling phase $\tau_i$ based on the estimated phase change $\theta_i$ received from a loop filter 320 that is connected between phase detectors $210_1$-$210_4$ and phase interpolators $240_1$-$240_4$ as indicated in FIG. 3.

Loop filter 320 has four first-order paths and four second-order paths. The i-th first-order path of loop filter 320 includes elements $222_i$, $224_i$, and $226_i$ and is configured to track the phase of digital signal $132_i$ generated by ADC $130_i$ (see FIG. 1). The first second-order path of loop filter 320 includes elements 228, 230, $224_1$, and $226_1$ and is configured to track the frequency of digital signal $132_1$ generated by ADC $130_1$ (see FIG. 1). The j-th second-order path of loop filter 320 (where j=2, 3, 4) includes elements 228, 230, $224_j$, and $226_j$ and is also configured to track the frequency of digital signal $132_1$ generated by ADC $130_1$ (see FIG. 1), but with lower accuracy than the just-mentioned first second-order path of loop filter 320. This lower frequency-tracking accuracy is associated with the fact that the j-th second-order path of loop filter 320 (where j=2, 3, 4) mixes present and past values of two different timing gradients, i.e., $\Delta_1$ and $\Delta_j$, to generate the value of $\theta_j$. In contrast, the first second-order path of loop filter 320 generates the value of $\theta_1$ based on timing gradient $\Delta_1$ alone, without using any of timing gradients $\Delta_j$. Alternatively, the operation of each of the three second-order paths of loop filter 320 corresponding to j=2, 3, 4 can be viewed as tracking only the approximated frequency of digital signal $132_j$ due to the use therein of timing gradient $\Delta_1$ in addition to the use of timing gradient $\Delta_j$.

Eqs. (3a)-(3d) give the four transfer functions, $L_1(z)$-$L_4(z)$, of loop filter 320:

$$L_1(z) = z^{-N}\left(\frac{\beta z^{-1}}{1-z^{-1}} + \alpha_1\right)\left(\frac{z^{-1}}{1-z^{-1}}\right) \quad (3a)$$

$$L_2(z) = z^{-N}\left(\frac{\beta z^{-1}}{1-z^{-1}} + \alpha_2\right)\left(\frac{z^{-1}}{1-z^{-1}}\right) \quad (3b)$$

$$L_3(z) = z^{-N}\left(\frac{\beta z^{-1}}{1-z^{-1}} + \alpha_3\right)\left(\frac{z^{-1}}{1-z^{-1}}\right) \quad (3c)$$

$$L_4(z) = z^{-N}\left(\frac{\beta z^{-1}}{1-z^{-1}} + \alpha_4\right)\left(\frac{z^{-1}}{1-z^{-1}}\right) \quad (3d)$$

where $\alpha_1$-$\alpha_4$ are the phase-update gains; and $\beta$ is the frequency-update gain. In one embodiment, at least two of phase-update gains $\alpha_1$-$\alpha_4$ may have the same value.

Note that all second-order paths of loop filter 320 share elements 228 and 230. As such, elements 228 and 230 of loop filter 320 provide an example of shared circuitry 178 (see FIG. 1).

This sharing is enabled by the fact that digital signals $132_1$-$132_4$ (FIG. 1) have very similar or substantially the same frequency, and that frequency differences (if any) can be effectively compensated using the phase tracking performed by the different first-order paths of loop filter 320.

In an alternative embodiment, each of the four second-order paths of loop filter 320 may be configured to track the frequency of any selected one of digital signals $132_j$ generated by ADCs $130_j$, where j=2, 3, 4 (see FIG. 1). The corresponding circuit modification involves tapping the input signal of gain element $222_j$ instead of gain element $222_1$, as shown in FIG. 3.

Additional embodiments of CR circuit 300 can be obtained using the following modifications of the circuitry shown in FIG. 3. The combination of looped shift register $226_i$ and phase interpolator $240_i$ (where i=1, 2, 3, 4) can be replaced by a respective voltage-controlled oscillator (VCO) configured to receive the output of adder $224_i$ and produce the digital code that controls the phase and frequency at which the corresponding ADC $130_i$ is clocked to sample electrical signal 122 (see FIG. 1). The resulting modified CR circuit 300 thus has a total of four such VCOs.

One of ordinary skill in the art will understand that a similar circuit modification can be applied to CR circuit 200 of FIG. 2.

Figure 4:
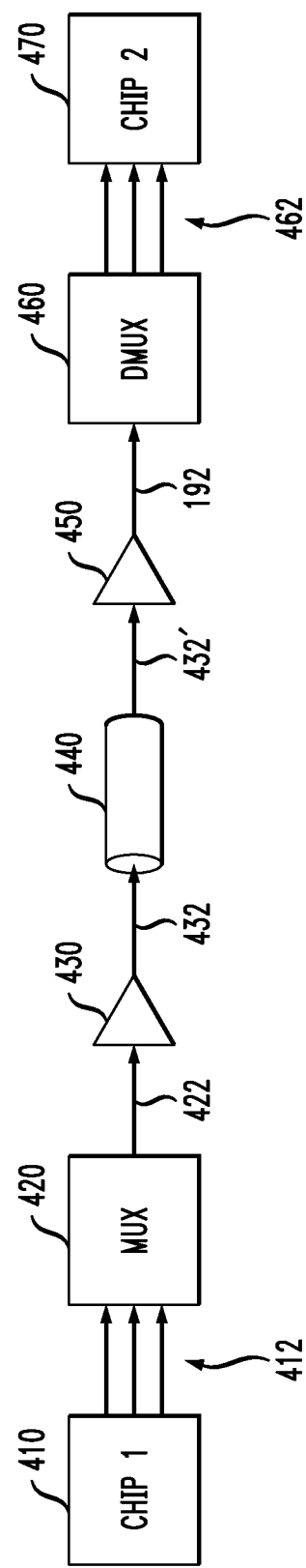
FIG. 4 shows a block diagram of a communication system that includes the receiver circuit of FIG. 1 according to an embodiment of the disclosure.

FIG. 4 shows a block diagram of a communication system 400 according to an embodiment of the disclosure. More specifically, system 400 is a chip-to-chip data-transfer system in which data are transported from a first chip (integrated circuit, labeled 410), through a communication channel 440, to a second chip (integrated circuit, labeled 470). In various embodiments, communication channel 440 may be a wired channel, a wireless channel, an optical channel, or a data-storage device, such as a magnetic disk drive.

In operation, a plurality of data streams 412 generated by chip 410 are multiplexed in a multiplexer 420, and a resulting multiplexed data stream 422 is applied to a transmitter 430. Transmitter 430 is configured to generate an appropriate output signal 432 that is modulated with the data of data stream 422 and then apply said output signal to communication channel 440. After being transported through communication channel 440, signal 432 becomes signal 432', which is applied to a receiver 450.

In an example embodiment, receiver 450 includes a front-end circuit and receiver circuit 100 (neither explicitly shown in FIG. 4). The front-end circuit of receiver 450 is configured to convert signal 432' into electrical signal 122 (see FIG. 1). Electrical output signal 192 generated by receiver circuit 100 of receiver 450 based on electrical signal 122 is applied to a de-multiplexer 460, which de-multiplexes said signal to generate a plurality of data streams 462. Data streams 462 are then applied to the appropriate pins of chip 470.

According to an example embodiment disclosed above in reference to FIGS. 1-4, provided is an apparatus comprising: M analog-to-digital converters (e.g., $130_1$-$130_4$, FIG. 1), each configured to generate, at a first rate (e.g., $R_r$), digital samples of an electrical input signal (e.g., 122, FIG. 1) modulated with data, where M is an integer greater than one; an interleaver (e.g., 136, FIG. 1) configured to time-interleave the digital samples generated by the M analog-to-digital converters to generate a sample stream (e.g., 138, FIG. 1) having a second rate (e.g., $R_f$) that is M times greater than the first rate; and a clock-and-data recovery loop (e.g., 190, FIG. 1) configured to process the sample stream to generate a data stream (e.g., 192, FIG. 1) carrying the data at the second rate and to set M sampling phases (e.g., $\tau_1$-$\tau_4$ or in accordance with Eqs. (1a)-(1d)), each for a respective one of the M analog-to-digital converters. The clock-and-data recovery loop comprises: a first de-interleaver (e.g., 168, FIG. 1) configured to time-de-interleave the data stream to generate M data signals (e.g., $170_1$-$170_4$, FIG. 1), each having the first rate; and M clock-recovery circuits (e.g., $174_1$-$174_4$, FIG. 1), each configured to set a respective one of the M sampling phases based on a respective one of the M data signals.

In some embodiments of the above apparatus, M=4 (as in FIG. 1).

In some embodiments of any of the above apparatus, the clock-and-data recovery loop is further configured to process the sample stream to generate an error signal (e.g., 194, FIG. 1) carrying, at the second rate, error values corresponding to the data. The clock-and-data recovery loop further comprises a second de-interleaver (e.g., 164, FIG. 1) configured to time-de-interleave the error signal to generate M de-interleaved error signals (e.g., $166_1$-$166_4$, FIG. 1), each having the first rate. Each of the M clock-recovery circuits is further configured to set the respective one of the M sampling phases based on a respective one of the M de-interleaved error signals.

In some embodiments of any of the above apparatus, each of the M clock-recovery circuits comprises: a respective phase detector (e.g., 210, FIG. 2) configured to process the respective one of the M data signals and the respective one of the M de-interleaved error signals to determine a respective timing gradient (e.g., Δ, FIG. 2); a respective loop filter (e.g., 220, FIG. 2) configured to combine present and past values of the respective timing gradient to generate a respective estimate for a phase change (e.g., θ, FIG. 2); and a respective phase interpolator (e.g., 240, FIG. 2) configured to generate a value of the respective one of the M sampling phases based on the respective estimate for the phase change received from the respective loop filter.

In some embodiments of any of the above apparatus, each of the respective loop filters comprises: a respective first-order path (e.g., including 222, 224, and 226, FIG. 2) configured to track, based on the respective timing gradient, a phase of a stream of the digital samples generated by the respective one of the M analog-to-digital converters; and a respective second-order path (e.g., including elements 228, 230, 224, and 226, FIG. 2) configured to track, based on the respective timing gradient, a frequency of said stream of the digital samples generated by the respective one of the M analog-to-digital converters. Each of the respective loop filters is configured to generate the respective estimate for the phase change based on said tracking of the phase and said tracking of the frequency.

In some embodiments of any of the above apparatus, the M clock-recovery circuits comprise: M phase detectors (e.g., $210_1$-$210_4$, FIG. 3), each configured to process the respective one of the M data signals and the respective one of the M de-interleaved error signals to determine a respective timing gradient (e.g., $\Delta_1$-$\Delta_4$, FIG. 3); a loop filter (e.g., 320, FIG. 3) configured to combine present and past values of different respective timing gradients (e.g., $\Delta_1$ and $\Delta_2$, FIG. 3) to generate M estimates for a phase change (e.g., $\theta_1$-$\theta_4$, FIG. 3); and M phase interpolators (e.g., $240_1$-$210_4$, FIG. 3), each configured to generate a value of the respective one of the M sampling phases based on a respective one of the M estimates for the phase change received from the loop filter.

In some embodiments of any of the above apparatus, the loop filter comprises: M first-order paths (e.g., including 222, 224, and 226, FIG. 3), each connecting a respective one of the M phase detectors and a respective one of the M phase interpolators and configured to track, based on the respective timing gradient, a phase of a stream of the digital samples generated by the respective one of the M analog-to-digital converters; and M second-order paths (e.g., including elements 228, 230, $224_1$-$224_4$, and $226_1$-$226_4$, FIG. 3), each connecting a common one of the of the M phase detectors (e.g., $210_1$, FIG. 3) and a respective one of the M phase interpolators and configured to track, based on the timing gradient determined by said common one of the of the M phase detectors, an approximated frequency of said stream of the digital samples generated by the respective one of the M analog-to-digital converters. The loop filter is configured to generate the M estimates for the phase change based on said tracking of the phases and said tracking of the approximated frequencies.

In some embodiments of any of the above apparatus, each of the M second-order paths includes a common frequency-update gain element (e.g., 228, FIG. 3).

In some embodiments of any of the above apparatus, each of the M second-order paths includes at least one common shift register (e.g., $z^{-1}$ in 230, FIG. 3).

In some embodiments of any of the above apparatus, each of the M second-order paths includes a common frequency-update gain element (e.g., 228, FIG. 3) and a common shift register (e.g., $z^{-1}$ in 230, FIG. 3).

In some embodiments of any of the above apparatus, the clock-and-data recovery loop further comprises: a feed-forward equalizer (e.g., 140, FIG. 1) configured to process the sample stream to reduce inter-symbol interference therein; a decision-feedback equalizer (e.g., 144, FIG. 1) configured to further process a processed sample stream generated by the feed-forward equalizer to further reduce inter-symbol interference therein based on previous symbol estimates received from a slicer (e.g., 150, FIG. 1); and the slicer (e.g., 150, FIG. 1) configured to generate a data stream based on a further-processed sample stream generated by the decision-feedback equalizer.

In some embodiments of any of the above apparatus, the clock-and-data recovery loop further comprises an error-estimation circuit (e.g., including 156, 160, FIG. 1) configured to generate an error signal (e.g., 194, FIG. 1) corresponding to the data in the data stream based on a comparison of the further-processed sample stream and the data stream.

In some embodiments of any of the above apparatus, the apparatus further comprises: a front-end circuit (e.g., 110, 120, FIG. 1) configured to generate the electrical input signal based on a communication signal (e.g., 102, FIG. 1; 432', FIG. 4) received via a communication channel (e.g., 440, FIG. 4); and a transmitter (e.g., 430, FIG. 4) coupled to the communication channel and configured to cause the front-end circuit to receive the communication signal.

In some embodiments of any of the above apparatus, the apparatus further comprises: a first electronic chip (e.g., 410, FIG. 4) configured to generate a first plurality of data streams (e.g., 412, FIG. 4) for transmission over the communication channel; a multiplexer (e.g., 420, FIG. 4) configured to: multiplex the first plurality of data streams 412 to generate a multiplexed data stream (e.g., 422, FIG. 4); and apply the multiplexed data stream to the transmitter to cause the transmitter to generate the communication signal; a de-multiplexer (e.g., 460, FIG. 4) configured to de-multiplex the data stream to generate a second plurality of data streams (e.g., 462, FIG. 4); and a second electronic chip (e.g., 470, FIG. 4) configured to receive the second plurality of data streams, each at a different respective pin thereof.

According to another example embodiment disclosed above in reference to FIGS. 1-4, provided is a method of sampling an electrical input signal (e.g., 122, FIG. 1) modulated with data, the method comprising: triggering M analog-to-digital converters (e.g., $130_1$-$130_4$, FIG. 1), each at a respective one of M sampling phases (e.g., $\tau_1$-$\tau_4$ or in accordance with Eqs. (1a)-(1d)) to cause each of said M analog-to-digital converters to generate, at a first rate (e.g., $R_r$), digital samples of the electrical input signal, where M is an integer greater than one; time-interleaving the digital samples generated by the M analog-to-digital converters in an interleaver (e.g., 136, FIG. 1) to generate a sample stream (e.g.,

138, FIG. 1) having a second rate (e.g., $R_f$) that is M times greater than the first rate; and setting the M sampling phases using a clock-and-data recovery loop. The step of setting comprises the sub-steps of: processing the sample stream to generate a data stream (e.g., 192, FIG. 1) carrying the data at the second rate; time-de-interleaving the data stream in a first de-interleaver (e.g., 168, FIG. 1) to generate M data signals (e.g., 170₁-170₄, FIG. 1), each having the first rate; and processing each of the M data signals in a respective one of M clock-recovery circuits (e.g., 174₁-174₄, FIG. 1) to determine a respective one of the M sampling phases.

In some embodiments of the above method, the step of setting further comprises the sub-steps of: processing the sample stream to generate an error signal (e.g., 194, FIG. 1) carrying, at the second rate, error values corresponding to the data; time-de-interleaving the error signal in a second de-interleaver (e.g., 164, FIG. 1) to generate M de-interleaved error signals (e.g., 166₁-166₄, FIG. 1), each having the first rate; and determining the respective one of the M sampling phases based on a respective one of the M de-interleaved error signals.

In some embodiments of any of the above methods, the M clock-recovery circuits comprise: M phase detectors (e.g., 210₁-210₄, FIG. 3), each configured to process the respective one of the M data signals and the respective one of the M de-interleaved error signals to determine a respective timing gradient (e.g., $\Delta_1$-$\Delta_4$, FIG. 3); a loop filter (e.g., 320, FIG. 3) configured to combine present and past values of different respective timing gradients (e.g., $\Delta_1$ and $\Delta_2$, FIG. 3) to generate M estimates for a phase change (e.g., $\theta_1$-$\theta_4$, FIG. 3); and M phase interpolators (e.g., 240₁-210₄, FIG. 3), each configured to generate a value of the respective one of the M sampling phases based on a respective one of the M estimates for the phase change received from the loop filter.

In some embodiments of any the above methods, the loop filter comprises: M first-order paths (e.g., including 222, 224, and 226, FIG. 3), each connecting a respective one of the M phase detectors and a respective one of the M phase interpolators and configured to track, based on the respective timing gradient, a phase of a stream of the digital samples generated by the respective one of the M analog-to-digital converters; and M second-order paths (e.g., including elements 228, 230, 224₁-224₄, and 226₁-226₄, FIG. 3), each connecting a common one of the of the M phase detectors (e.g., 210₁, FIG. 3) and a respective one of the M phase interpolators and configured to track, based on the timing gradient determined by said common one of the of the M phase detectors, an approximated frequency of said stream of the digital samples generated by the respective one of the M analog-to-digital converters. The loop filter is configured to generate the M estimates for the phase change based on said tracking of the phases and said tracking of the approximated frequencies.

According to yet another example embodiment disclosed above in reference to FIGS. 1-4, provided is a method of sampling an electrical input signal (e.g., 122, FIG. 1), the method comprising: triggering M analog-to-digital converters (e.g., 130₁-130₄, FIG. 1), each at a respective one of M sampling phases (e.g., $\tau_1$-$\tau_4$ or in accordance with Eqs. (1a)-(1d)), to cause each of said M analog-to-digital converters to generate, at a first rate (e.g., $R_r$), digital samples of the electrical input signal, where M is an integer greater than one; time-interleaving the digital samples generated by the M analog-to-digital converters in an interleaver (e.g., 136, FIG. 1) to generate a sample stream (e.g., 138, FIG. 1) having a second rate (e.g., $R_f$) that is M times greater than the first rate; tracking a frequency of a selected one (e.g., 132₁, FIG. 1) of M streams (e.g., 132₁-132₄, FIG. 1) of the digital samples generated by the M analog-to-digital converters to obtain (e.g., as shown in FIG. 3) M−1 frequency estimates, each being an estimate of a frequency of a respective one of the remaining M−1 of the M streams of the digital samples; determining a sampling phase for an analog-to-digital converter that generates said selected one of the M streams of the digital samples based on said tracking of the frequency and by tracking a phase of said selected one of the M streams of the digital samples using a respective one of M clock recovery circuits (e.g., 300, FIG. 3); and determining each of the remaining M−1 of the M sampling phases based on a respective one of the M−1 frequency estimates obtained using said tracking of the frequency and by tracking a phase of a respective one of the remaining M−1 of the M streams of the digital samples using a respective one of the remaining M−1 of the M clock recovery circuits.

While this invention has been described with reference to illustrative embodiments, this description is not intended to be construed in a limiting sense.

For example, as used in the claims, the term "phase interpolator" should be construed to cover VCO-based embodiments, e.g., those in which the combination of looped shift register 226ᵢ and phase interpolator 240ᵢ (where i=1, 2, 3, 4) is replaced by a respective voltage-controlled oscillator (VCO) configured to receive the output of adder 224ᵢ and produce the digital code that controls the phase and frequency at which the corresponding ADC 130ᵢ is clocked to sample electrical signal 122 (see FIGS. 1 and 3).

Various modifications of the described embodiments, as well as other embodiments, which are apparent to persons skilled in the art to which the invention pertains are deemed to lie within the scope of the invention as expressed in the following claims.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of various embodiments may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The functions of the various elements shown in the figures, including any functional blocks labeled as "processors," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Although embodiments of the invention have been described herein with reference to the accompanying drawings, it is to be understood that embodiments of the invention are not limited to the described embodiments, and one of ordinary skill in the art will be able to contemplate various other embodiments of the invention within the scope of the following claims.

What is claimed is:

1. An apparatus comprising:
    M analog-to-digital converters, each configured to generate, at a first rate, digital samples of an electrical input signal modulated with data, where M is an integer greater than one;
    an interleaver configured to time-interleave the digital samples generated by the M analog-to-digital converters to generate a sample stream having a second rate that is M times greater than the first rate; and
    a clock-and-data recovery loop configured to process the sample stream to generate a data stream carrying the data at the second rate and to set M sampling phases, each for a respective one of the M analog-to-digital converters, wherein the clock-and-data recovery loop comprises:
        a first de-interleaver configured to time-de-interleave the data stream to generate M data signals, each having the first rate; and
        M clock-recovery circuits, each configured to set a respective one of the M sampling phases based on a respective one of the M data signals.

2. The apparatus of claim 1, wherein M=4.

3. The apparatus of claim 1,
    wherein the clock-and-data recovery loop is further configured to process the sample stream to generate an error signal carrying, at the second rate, error values corresponding to the data;
    wherein the clock-and-data recovery loop further comprises a second de-interleaver configured to time-de-interleave the error signal to generate M de-interleaved error signals, each having the first rate; and
    wherein each of the M clock-recovery circuits is further configured to set the respective one of the M sampling phases based on a respective one of the M de-interleaved error signals.

4. The apparatus of claim 3, wherein each of the M clock-recovery circuits comprises:
    a respective phase detector configured to process the respective one of the M data signals and the respective one of the M de-interleaved error signals to determine a respective timing gradient;
    a respective loop filter configured to combine present and past values of the respective timing gradient to generate a respective estimate for a phase change; and
    a respective phase interpolator configured to generate a value of the respective one of the M sampling phases based on the respective estimate for the phase change received from the respective loop filter.

5. The apparatus of claim 4,
    wherein each of the respective loop filters comprises:
        a respective first-order path configured to track, based on the respective timing gradient, a phase of a stream of the digital samples generated by the respective one of the M analog-to-digital converters; and
        a respective second-order path configured to track, based on the respective timing gradient, a frequency of said stream of the digital samples generated by the respective one of the M analog-to-digital converters; and
    wherein each of the respective loop filters is configured to generate the respective estimate for the phase change based on said tracking of the phase and said tracking of the frequency.

6. The apparatus of claim 3, wherein the M clock-recovery circuits comprise:
    M phase detectors, each configured to process the respective one of the M data signals and the respective one of the M de-interleaved error signals to determine a respective timing gradient;
    a loop filter configured to combine present and past values of different respective timing gradients to generate M estimates for a phase change; and
    M phase interpolators, each configured to generate a value of the respective one of the M sampling phases based on a respective one of the M estimates for the phase change received from the loop filter.

7. The apparatus of claim 6, wherein M=4.

8. The apparatus of claim 6,
    wherein the loop filter comprises:
        M first-order paths, each connecting a respective one of the M phase detectors and a respective one of the M phase interpolators and configured to track, based on the respective timing gradient, a phase of a stream of the digital samples generated by the respective one of the M analog-to-digital converters; and
        M second-order paths, each connecting a common one of the of the M phase detectors and a respective one of the M phase interpolators and configured to track, based on the timing gradient determined by said common one of the of the M phase detectors, an approximated frequency of said stream of the digital samples generated by the respective one of the M analog-to-digital converters; and
    wherein the loop filter is configured to generate the M estimates for the phase change based on said tracking of the phases and said tracking of the approximated frequencies.

9. The apparatus of claim 8, wherein each of the M second-order paths includes a common frequency-update gain element.

10. The apparatus of claim 8, wherein each of the M second-order paths includes at least one common shift register.

11. The apparatus of claim 8, wherein each of the M second-order paths includes a common frequency-update gain element and a common shift register.

12. The apparatus of claim 1, wherein the clock-and-data recovery loop further comprises:
a feed-forward equalizer configured to process the sample stream to reduce inter-symbol interference therein;
a decision-feedback equalizer configured to further process a processed sample stream generated by the feed-forward equalizer to further reduce inter-symbol interference therein based on previous symbol estimates received from a slicer; and
the slicer configured to generate a data stream based on a further-processed sample stream generated by the decision-feedback equalizer.

13. The apparatus of claim 12, wherein the clock-and-data recovery loop further comprises an error-estimation circuit configured to generate an error signal corresponding to the data in the data stream based on a comparison of the further-processed sample stream and the data stream.

14. The apparatus of claim 1, further comprising:
a front-end circuit configured to generate the electrical input signal based on a communication signal received via a communication channel; and
a transmitter coupled to the communication channel and configured to cause the front-end circuit to receive the communication signal.

15. The apparatus of claim 14, further comprising:
a first electronic chip configured to generate a first plurality of data streams for transmission over the communication channel;
a multiplexer configured to:
multiplex the first plurality of data streams to generate a multiplexed data stream; and
apply the multiplexed data stream to the transmitter to cause the transmitter to generate the communication signal;
a de-multiplexer configured to de-multiplex the data stream to generate a second plurality of data streams;
a second electronic chip configured to receive the second plurality of data streams, each at a different respective pin thereof.

16. A method of sampling an electrical input signal modulated with data, the method comprising:
triggering M analog-to-digital converters, each at a respective one of M sampling phases to cause each of said M analog-to-digital converters to generate, at a first rate, digital samples of the electrical input signal, where M is an integer greater than one;
time-interleaving the digital samples generated by the M analog-to-digital converters in an interleaver to generate a sample stream having a second rate that is M times greater than the first rate; and
setting the M sampling phases using a clock-and-data recovery loop, wherein said setting comprises:
processing the sample stream to generate a data stream carrying the data at the second rate;
time-de-interleaving the data stream in a first de-interleaver to generate M data signals, each having the first rate; and
processing each of the M data signals in a respective one of M clock-recovery circuits to determine a respective one of the M sampling phases.

17. The method of claim 16, wherein said setting further comprises:
processing the sample stream to generate an error signal carrying, at the second rate, error values corresponding to the data;
time-de-interleaving the error signal in a second de-interleaver to generate M de-interleaved error signals, each having the first rate; and
determining the respective one of the M sampling phases based on a respective one of the M de-interleaved error signals.

18. The method of claim 17, wherein the M clock-recovery circuits comprise:
M phase detectors, each configured to process the respective one of the M data signals and the respective one of the M de-interleaved error signals to determine a respective timing gradient;
a loop filter configured to combine present and past values of different respective timing gradients to generate M estimates for a phase change; and
M phase interpolators, each configured to generate a value of the respective one of the M sampling phases based on a respective one of the M estimates for the phase change received from the loop filter.

19. The method of claim 18,
wherein the loop filter comprises:
M first-order paths, each connecting a respective one of the M phase detectors and a respective one of the M phase interpolators and configured to track, based on the respective timing gradient, a phase of a stream of the digital samples generated by the respective one of the M analog-to-digital converters; and
M second-order paths, each connecting a common one of the of the M phase detectors and a respective one of the M phase interpolators and configured to track, based on the timing gradient determined by said common one of the of the M phase detectors, an approximated frequency of said stream of the digital samples generated by the respective one of the M analog-to-digital converters; and
wherein the loop filter is configured to generate the M estimates for the phase change based on said tracking of the phases and said tracking of the approximated frequencies.

20. A method of sampling an electrical input signal, the method comprising:
triggering M analog-to-digital converters, each at a respective one of M sampling phases, to cause each of said M analog-to-digital converters to generate, at a first rate, digital samples of the electrical input signal, where M is an integer greater than one;
time-interleaving the digital samples generated by the M analog-to-digital converters in an interleaver to generate a sample stream having a second rate that is M times greater than the first rate;
tracking a frequency of a selected one of M streams of the digital samples generated by the M analog-to-digital converters to obtain M−1 frequency estimates, each being an estimate of a frequency of a respective one of the remaining M−1 of the M streams of the digital samples;
determining a sampling phase for an analog-to-digital converter that generates said selected one of the M streams of the digital samples based on said tracking of the frequency and by tracking a phase of said selected one of the M streams of the digital samples using a respective one of M clock recovery circuits; and determining each of the remaining M−1 of the M sampling phases based on a respective one of the M−1 frequency estimates obtained using said tracking of the frequency and by tracking a phase of a respective one of the remaining M−1 of the M streams of the digital samples using a respective one of the remaining M−1 of the M clock recovery circuits.

* * * * *